(12) United States Patent
Aparicio Rollan et al.

(10) Patent No.: US 9,442,166 B2
(45) Date of Patent: Sep. 13, 2016

(54) BATTERY MONITORING ASSEMBLY HAVING BATTERY MONITOR MODULE AND CABLE FOR CONNECTION TO A SHUNT OF THE MODULE

(71) Applicant: Lear Corporation, Southfield, MI (US)

(72) Inventors: Enric Aparicio Rollan, Valls (ES); Josep Maria Roset Rubio, Valls (ES)

(73) Assignee: Lear Corporation, Southfield, MI (US)

( * ) Notice: Subject to any disclaimer, the term of this patent is extended or adjusted under 35 U.S.C. 154(b) by 263 days.

(21) Appl. No.: 14/177,671

(22) Filed: Feb. 11, 2014

(65) Prior Publication Data

US 2014/0327444 A1 Nov. 6, 2014

Related U.S. Application Data

(60) Provisional application No. 61/818,975, filed on May 3, 2013.

(51) Int. Cl.
| | |
|---|---|
| *G01N 27/416* | (2006.01) |
| *H02J 7/14* | (2006.01) |
| *B60L 1/00* | (2006.01) |
| *H01R 4/28* | (2006.01) |
| *G01R 31/36* | (2006.01) |

(52) U.S. Cl.
CPC ................................ *G01R 31/3696* (2013.01)

(58) Field of Classification Search
CPC .................................................. G01R 31/3696
USPC .................. 320/104, 105; 439/754; 324/426; 307/10.1
See application file for complete search history.

(56) References Cited

U.S. PATENT DOCUMENTS

| | | | |
|---|---|---|---|
| 4,252,869 A | 2/1981 | Heitz et al. | |
| 6,538,203 B1* | 3/2003 | Nolle | H01R 4/62 174/84 C |
| 7,573,274 B2* | 8/2009 | Aratani | G01R 1/203 324/117 R |
| 8,147,280 B2 | 4/2012 | Fernandez et al. | |
| 8,305,034 B2 | 11/2012 | Rubio | |
| 8,476,864 B2* | 7/2013 | Ferre Fabregas | G01R 1/203 320/104 |
| 2008/0194152 A1 | 8/2008 | Roset et al. | |
| 2008/0309469 A1 | 12/2008 | Ferre Fabregas et al. | |
| 2010/0019733 A1 | 1/2010 | Rubio | |
| 2011/0076888 A1* | 3/2011 | Fernandez | H01M 10/48 439/620.01 |

FOREIGN PATENT DOCUMENTS

| | | |
|---|---|---|
| CN | 1016346188 A | 1/2010 |
| CN | 101855783 A | 10/2010 |
| JP | 2006024523 A | 1/2006 |

OTHER PUBLICATIONS

Chinese Patent Office, Chinese Office Action for the corresponding Chinese Patent Application No. 201410176122.6 dated Nov. 4, 2015.

(Continued)

*Primary Examiner* — Richard V Muralidar
(74) *Attorney, Agent, or Firm* — Brooks Kushman P.C.

(57) ABSTRACT

A vehicle battery monitoring assembly includes a terminal connectable to a battery post, a shunt formed of a first metallic material, and a cable formed of a different second metallic material. The shunt is connected at one end to the terminal. The assembly further includes a sheet formed of the second metallic material. The sheet is attached on a portion of another end of the shunt. The cable is connected at one end to the sheet.

9 Claims, 4 Drawing Sheets

(56) References Cited

OTHER PUBLICATIONS

Chinese Patent Office, 2nd Chinese Office Action for corresponding Chinese Patent Application 201410176122.6 dated Jul. 5, 2016.

Chinese Patent Office, English translation for 2nd Chinese Office Action for corresponding Chinese Patent Application No. 201410176122.6 dated Jul. 5, 2016.

* cited by examiner

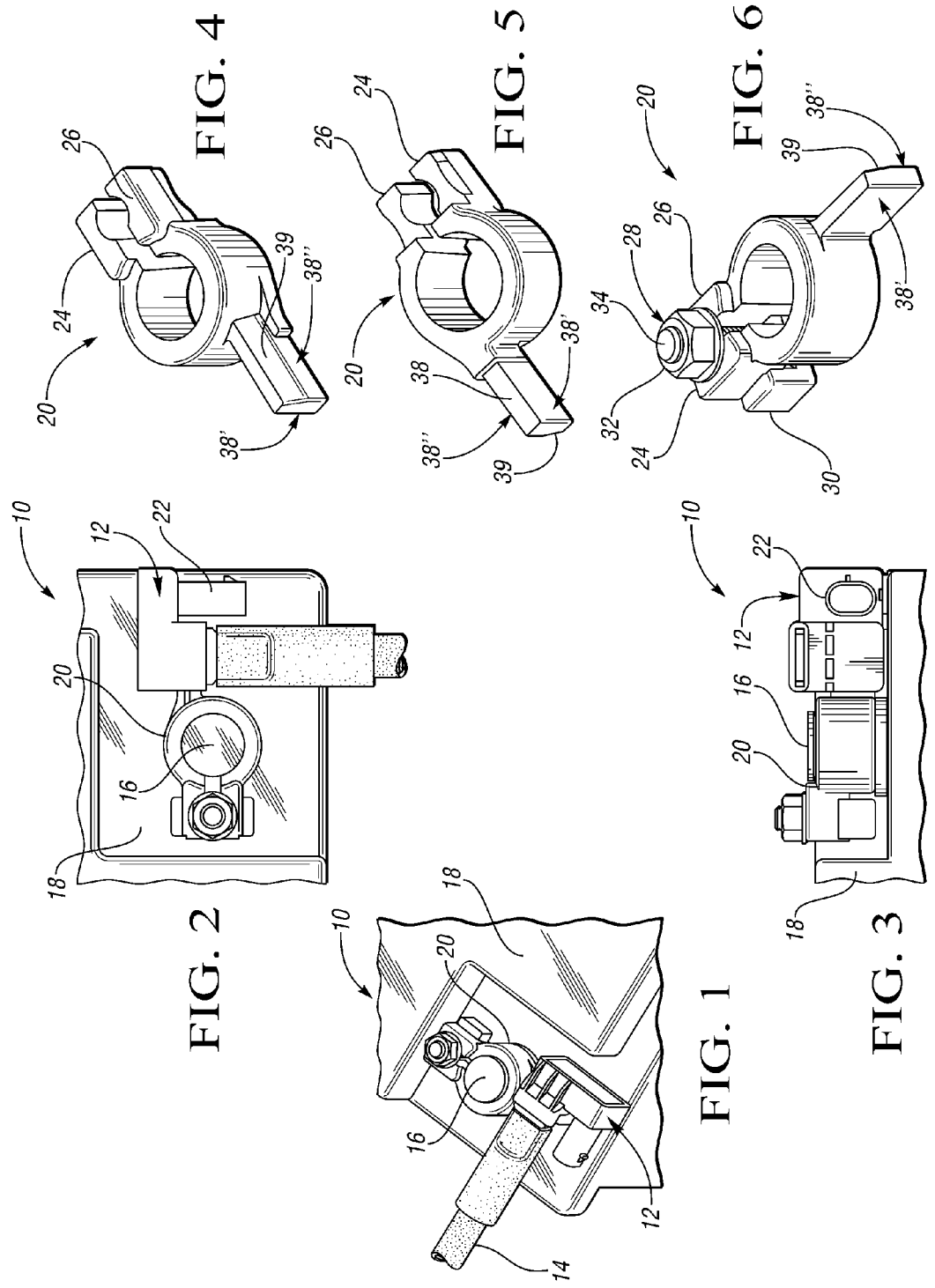

BATTERY MONITORING ASSEMBLY HAVING BATTERY MONITOR MODULE AND CABLE FOR CONNECTION TO A SHUNT OF THE MODULE

CROSS-REFERENCE TO RELATED APPLICATIONS

This application claims the benefit of U.S. Provisional Application No. 61/818,975, filed May 3, 2013; the disclosure of which is hereby incorporated in its entirety by reference herein.

TECHNICAL FIELD

The present invention relates to battery monitoring systems of the type that can be connected to a battery post to measure battery operating conditions.

BACKGROUND

Hybrid and non-hybrid vehicles may be equipped with energy storage devices, such as batteries for powering of the vehicle and other devices within the vehicle. A battery monitor may be connected to a battery post and configured to sense battery operating conditions. These types of connectors may be employed in automotive vehicles having lead-acid or some other type of battery or similar energy storage device. The battery monitor may be advantageous in reporting the battery operating conditions to a junction box or other vehicle system controller.

SUMMARY

An embodiment of the present invention provides a vehicle battery monitoring assembly. The assembly includes a terminal connectable to a battery post, a shunt formed of a first metallic material, and a cable formed of a different second metallic material. The shunt is connected at one end to the terminal. The assembly further includes a sheet formed of the second metallic material. The sheet is attached on a portion of another end of the shunt. The cable is connected at one end to the sheet.

BRIEF DESCRIPTION OF THE DRAWINGS

FIGS. 1, 2, and 3 illustrate respective views of a battery monitoring assembly in accordance with a first embodiment of the present invention;

FIGS. 4, 5, and 6 illustrate respective views of a terminal of the battery monitoring assembly in accordance with the first embodiment of the present invention;

DETAILED DESCRIPTION

Figure 8:
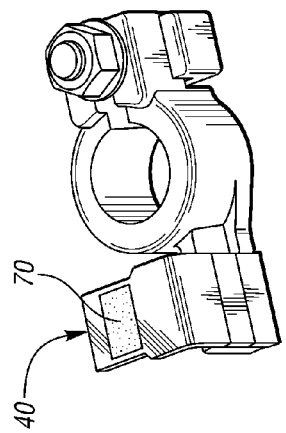
FIGS. 7, 8, and 9 illustrate respective views of a shunt attached on one end to the terminal of the battery monitoring assembly.

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Referring now to FIGS. 1, 2, and 3, respective views of a battery monitoring assembly 10 in accordance with a first embodiment of the present invention are shown. Battery monitoring assembly 10 includes a battery monitor module 12 and a cable 14 for connection to battery monitor module 12. Battery monitor module 12 may be connected to a battery post 16 of a battery 18 to sense operating conditions of the battery. Battery 18 may be a lead-acid or other energy storage/output device (capacitor, fuel cell, etc.) commonly employed within vehicles. Battery monitor module 12 in this embodiment may be securely connected to battery post 16 with compressive tightening of a terminal 20 or other suitable connection. Battery monitor module 12 may be configured or otherwise programmed to support any number of operations such as measuring/sensing current, voltage, and temperatures associated with battery 18.

Battery monitor module 12 may include a network interface 22 for interfacing with a network vehicle element (not shown) such as a junction box, bus, network, etc. Network interface 22 may be used to interface any number of signals between battery monitor module 12 and the vehicle system controller or other network vehicle element, i.e., any element not intended to exchange current directly with battery 18. For example, one or two-way communications may be established with battery monitor module 12 to facilitate any number of operations such as operations associated with sensing and measuring current, voltage, temperature, and other operating parameters of battery 18.

Referring now to FIGS. 4, 5, and 6, with continual reference to FIGS. 1, 2, and 3, respective views of terminal 20 for use with battery monitoring assembly 10 are shown. Terminal 20 may include a tinned brass or other material suitable for conducting electricity from battery post 16. Terminal 20 may be configured for attachment to a cylindrical, conical or other shaped battery post 16. Terminal 20 includes two clamps 24 and 26 that compress together with a vertical tightening of a screwing system 28. A face (not shown) of a plate 30 used in screwing system 28 may be angled or otherwise shaped to cause clamps 24 and 26 to move together with downward compression of a nut 32 and bolt 34 arrangement.

Terminal 20 further includes an arm 38 extending opposite to the side of screwing system 28 to facilitate electrical connection to a shunt 40 (shunt 40 shown in other Figures). Arm 38 may include a first side 38' and a second side 38" that are generally vertical or parallel to battery post 16. A portion 39 of arm 38 may be angled relative to the rest of the second side 38" such that the cross-section is differentiated from the portion below it. The electrical connection supported by arm 38 may be used to connect battery post 16 to other vehicle elements (not shown).

Figure 7:
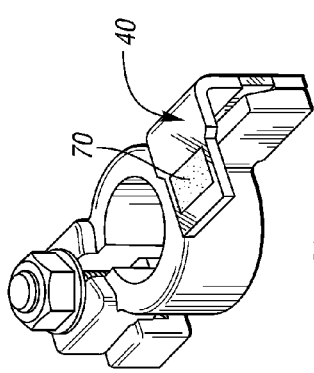
Figure 9:
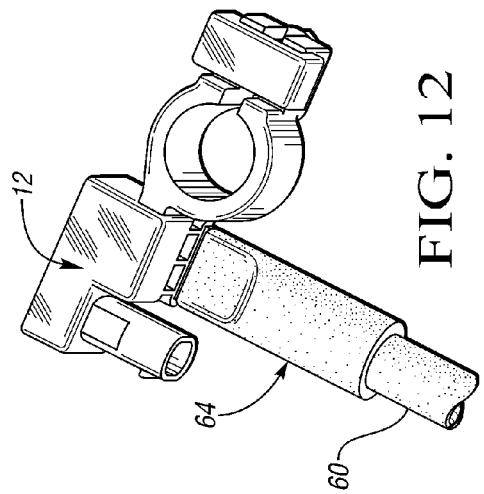

Referring now to FIGS. 7, 8, and 9, with continual reference to the preceding Figures, respective views of shunt 40 attached on one end to terminal 20 are shown. Shunt 40 includes a bi-metallic body having copper (or copper alloy) portions 54 and 56 and a resistive copper (or resistive copper alloy) portion 58. Resistive copper portion 58 may include manganin. Copper portions 54 and 56 respectively correspond with the ends of shunt 40. Resistive copper portion 58 is arranged between copper portions 54 and 56 such that current must flow in either direction from through one of copper portions 54 and 56, through resistive copper portion 58, and finally through the other one of the copper portions 54 and 56, depending on whether battery 18 is charging or discharging. Resistive copper portion 58 may be used as a measuring element suitable conducting high currents.

Shunt 40 includes a first side 40' and a second side 40". First side 40' of shunt 40 faces arm 38 of terminal 20. A cross-section of shunt 40 corresponding with measurement portion 58 may be less in thickness than the non-measurement portions 54 and 56 in order to form a slight recess on first shunt side 40' relative to a plane corresponding with the corresponding first shunt side 40' of non-measurement portions 54 and 56.

Figure 11:
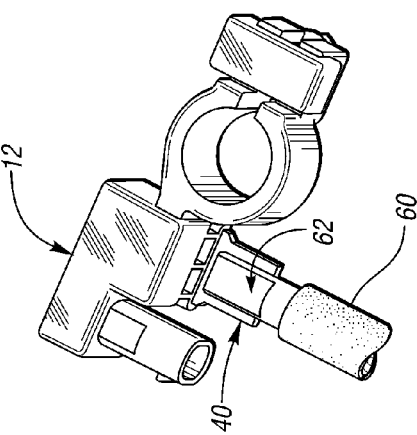
FIGS. 10, 11, and 12 illustrate respective views of the battery monitoring assembly in an assembled state in which the shunt runs through the battery monitor module and is attached on the one end to the terminal and is attached on another end to a cable.
Figure 10:
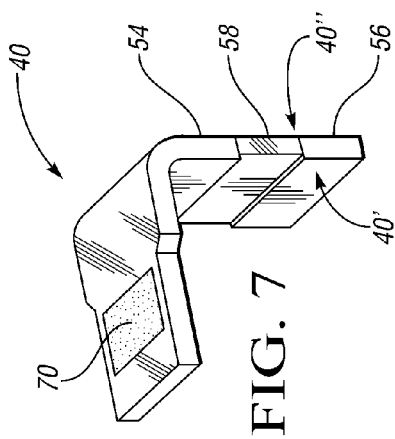
Figure 12:
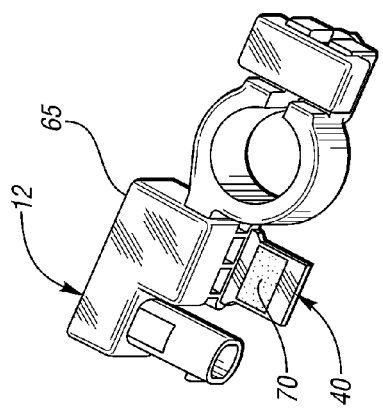

Referring now to FIGS. 10, 11, and 12, with continual reference to the preceding Figures, respective views of battery monitoring assembly 10 in an assembled state are shown. In the assembled state of battery monitoring assembly 10, shunt 40 runs through battery monitor module 12 and is attached on the one end to terminal 20 via arm 38 of terminal 20 and is attached on another end to a cable 60. As such, when terminal 20 is connected to battery post 16, an electrical connection is established between battery post 16 and cable 60 via shunt 40 and terminal 20. Cable 60 is a cable, wire, or other element suitable for conducting electricity between battery 18 and a vehicle element. Cable 60 includes an outer insulated portion surrounding an inner metallic portion. Inner metallic portion of cable 60 is formed of metallic wire strands 62. Wire strands 62 of cable 60 extend out from the outer insulated portion at one end of cable 60. Wire strands 62 at this end of cable 60 and the end of shunt 40 are fastened to one another such as by welding or soldering to thereby attach cable 60 and shunt 40 together.

A soldering machine or other welding element may be configured to compress wire strands 62 of cable 60 from their circular shape within cable 60 to a flatter shape more suitable for fastening to shunt 40. Once wire strands 62 are fastened to shunt 40, or in the same assembly process, an insulated material 64 may be heat shrunk over wire strand connection region 62. For example, a shrink wrap tubular material may be applied around shunt 40 and compressed for a snug fit by heating. Wrap 64 may provide insulation to the conducting portion of the connector and/or additional insulation such as to cover a gap where shunt 40 and the beginning of the cable insulation.

As shown in the Figures, battery monitor module 12 includes a housing 65. Module housing 65 houses a portion of shunt 40. Module housing 65 may include a non-conducting material configured for covering first arm side 38' of terminal 20 and second shunt side 40" of shunt 40. Module housing 65 may be molded around terminal 20 and shunt 40 after shunt 40 is attached to arm 38 of terminal 20. Battery monitor module 12 may further include a printed circuit board (PCB) within the module housing. The PCB is used to assess battery operations. For instance, the PCB and shunt 40 may be press-fit together to establish an electrical connection for use in assessing battery operations. The PCB may also be electrically connected to network interface 22.

As indicated above, with reference to FIGS. 7, 8, and 9, shunt 40 includes a bi-metallic body having copper portions 54 and 56 and resistive copper portion 58. Copper portions 54 and 56 respectively correspond with the ends of shunt 40 and resistive copper portion 58 is arranged between copper portions 54 and 56. As such, shunt 40 has a core body formed from copper (and/or copper alloy).

In accordance with embodiments of the present invention, shunt 40 further includes a metallic sheet 70. That is, shunt 40 includes the core copper body and metallic sheet 70. Metallic sheet 70 is integrated onto the copper portion (i.e., copper portion 54) on the end of shunt 40 of which wire strands 62 of cable 60 are to be attached by welding or soldering. Further, metallic sheet 70 is formed of a metal different than the copper (copper alloy) and the resistive copper (resistive copper alloy) forming the bi-metallic body of shunt 40. In particular, metallic sheet 70 and the inner metallic portion of cable 60 (i.e., metallic strands 62) are formed of the same metal and this same metal is different than the copper (copper alloy) and the resistive copper (resistive copper alloy) forming the bi-metallic body of shunt 40. In an embodiment, metallic sheet 70 is an aluminum sheet and the inner metallic portion of cable 60 is formed of aluminum. As such, wire strands 62 of cable 60 are aluminum strands.

In this embodiment, the body of shunt 40 is formed of copper, metallic sheet 70 integrated on a portion of shunt 40 is formed of aluminum, and cable 60 is formed of aluminum. As a result, metallic sheet 70 and cable 60 are formed of the same type of metal (i.e., aluminum) which is different than the type of metal (i.e., copper) forming the main body of shunt 40.

Typically, a copper cable is used as cable 60 on this type of application as standard as the shunt is generally formed of copper. However, an aluminum cable may have a lower cost than a corresponding copper cable. A problem with using an aluminum cable as cable 60 is that the aluminum cable cannot be welded directly on a copper shunt using brazing or ultrasonic welding because the melting points of the two metals (aluminum and copper) are too different. On the other hand, a copper shunt cannot be replaced by aluminum due to compatibility with the standard and currently unique alternative of resistor material of the shunt (e.g., Seebeck effect). Therefore, in this embodiment, aluminum sheet 70 is provided (e.g., integrated) on the welding portion of shunt 40 to make possible the aluminum cable welding on (copper) shunt 40. Aluminum sheet 70 is integrated on copper shunt 40 in accordance with embodiments of the present invention using a different attachment process other than welding or soldering due to the incompatibility in the material thermal properties as described above. In particular, aluminum sheet 70 is integrated on the portion of shunt 40, at which cable strands 62 are to be welded or attached, by being stamped or cladded onto this shunt portion.

Figure 13:
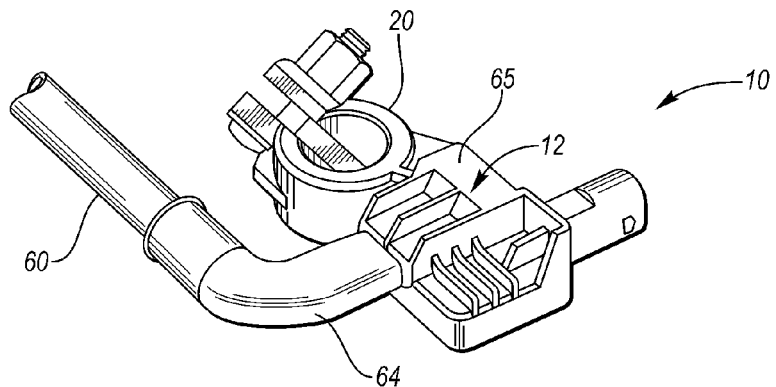
FIG. 13 illustrates a perspective view of the battery monitoring assembly in accordance with the embodiment of the present invention as assembled.

FIG. 13 illustrates a perspective view of battery monitoring assembly 10 in accordance with this embodiment of the present invention as assembled. Battery monitoring assembly 10 includes battery monitoring module ("BMS" module—battery monitoring system module) 12, terminal 20, copper shunt 40 (housed within module housing 65), and aluminum cable 60. Shrink tube 64 encompasses the end of cable 60 and the portion of shunt 40 attached to one another.

Figure 14:
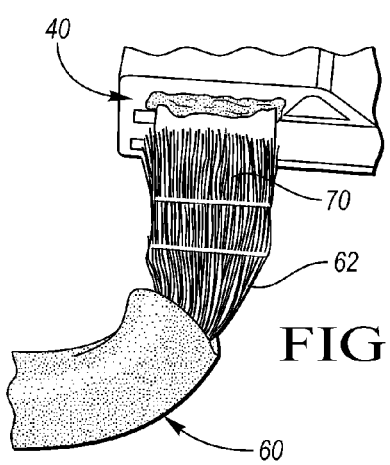
FIG. 14 illustrates an enlarged view of the welding attachment between the cable strands and the welding portion sheet of the shunt of the assembly of FIG. 13.

With reference to FIG. 13, FIG. 14 illustrates an enlarged view of the welding attachment between aluminum strands 62 of cable 60 and aluminum sheet 70 on the welding portion of shunt 40. That is, FIG. 14 illustrates an enlarged view of the welding attachment within shrink tube 64.

The embodiment of the present invention in which aluminum sheet 70 is integrated onto the cable welding area of a copper shunt such as shunt 40 enables aluminum cable 60 to be welded or soldered to copper shunt 40. The aluminum integration on shunt 40 has to be done on the cable welding portion of shunt 40. This aluminum can be integrated using different methods including stamping or cladding aluminum sheet 70 onto the cable welding portion of copper shunt 40.

Figure 15:
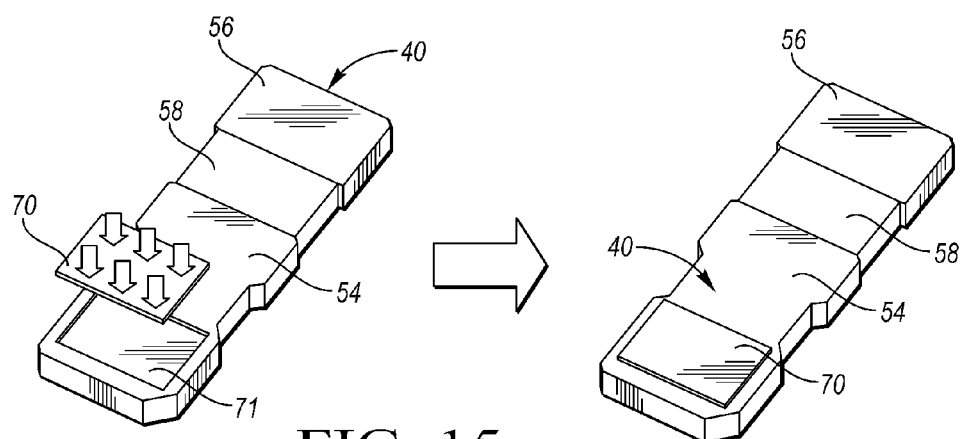
FIG. 15 illustrates the stamping of a metallic sheet onto the cable welding area of a shunt in accordance with an embodiment of the present invention.

FIG. 15 illustrates the stamping of a metallic sheet such as aluminum sheet 70 onto a cable welding portion 71 of a different metal shunt such as copper shunt 40 in accordance with an embodiment of the present invention. This stamping process may also be used on battery clamps.

Figure 16A:
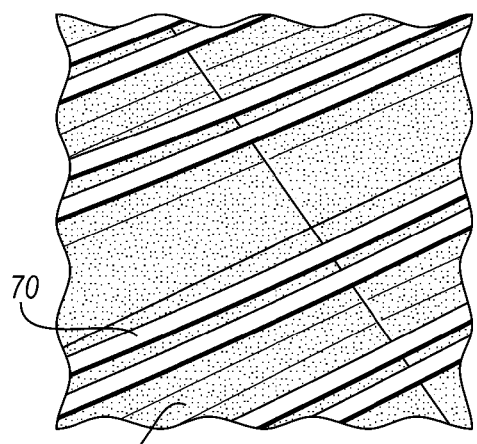
FIGS. 16A, 16B, and 16C illustrate the cladding of a metallic sheet onto the cable welding area of a shunt in accordance with an embodiment of the present invention.
Figure 16B:
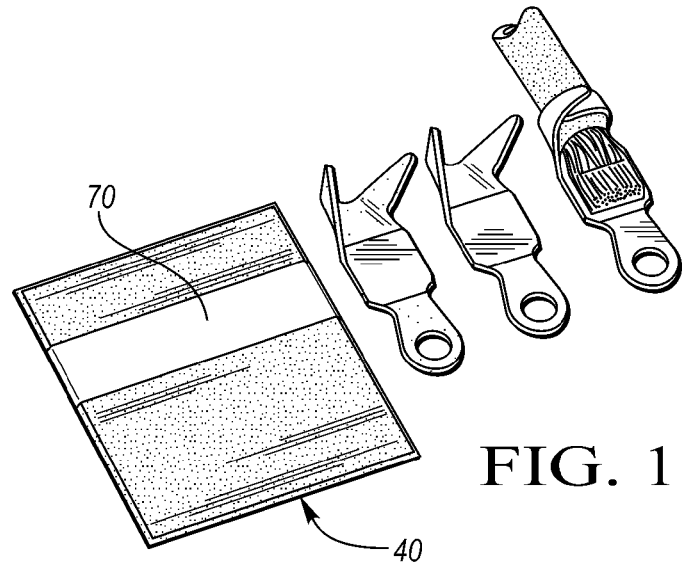
Figure 16C:
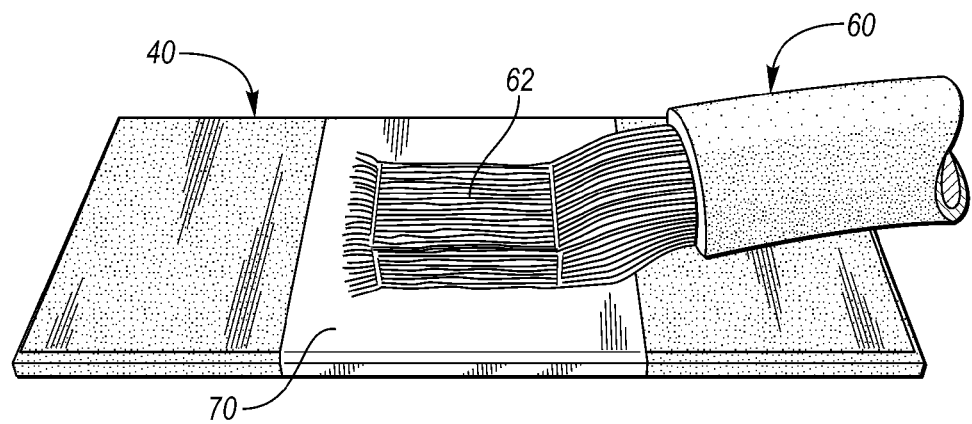

FIGS. 16A, 16B, and 16C illustrate the cladding a metallic sheet such as aluminum sheet 70 onto cable welding portion 71 of a different metal shunt such as copper shunt 40. As shown in FIG. 16B, this cladding process may also be used on ground terminals. As shown in FIG. 16C, aluminum strands 62 of cable 60 are attached to aluminum sheet 70.

Regardless of whether metallic sheet 70 is cladded or stamped or is attached by other means onto the corresponding portion of shunt 40, wire strands 62 may be attached to metallic sheet 70 by welding, soldering, or a crimped or double-crimped connection, and the like.

As described, copper is typically used both on shunts (mandatory) and cables (the most standard option). A copper cable and a copper shunt can be welded directly without problems. An aluminum cable has certain advantages over a corresponding copper cable, but an aluminum cable cannot be welded directly on a copper shunt. The welding operation of an aluminum cable to a copper shunt can be done when the contact area on the shunt has some kind of aluminum layer integrated thereon. As a conclusion, a current BMS could replace directly its copper cable by aluminum cable if the shunt integrates an aluminum layer on the welding area of the shunt. Integration of this aluminum layer onto the shunt can be done in different ways.

As further described, an embodiment of the present invention provides a direct connection of an aluminum cable onto the copper shunt for a BMS system without changing the current design and process concept. The change is an aluminum sheet integrated onto the current shunt.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A vehicle battery monitoring assembly comprising:
a terminal connectable to a battery post;
a shunt formed of a first metallic material, the shunt connected at one end to the terminal;
a cable formed of a different second metallic material; and
a sheet formed of the second metallic material, the sheet attached on a portion of another end of the shunt irrespective of any connection of the cable to any of the sheet and the shunt;
wherein the cable is connected at one end to the sheet without contacting the shunt.

2. The assembly of claim 1 wherein:
the second metallic material is aluminum.

3. The assembly of claim 2 wherein:
the first metallic material includes copper.

4. The assembly of claim 1 wherein:
the sheet is stamped on the portion of the other end of the shunt to be attached on the portion of the other end of the shunt.

5. The assembly of claim 1 wherein:
the sheet is cladded on the portion of the other end of the shunt to be attached on the portion of the other end of the shunt.

6. The assembly of claim 1 wherein:
the end of the cable is welded to the sheet to be connected to the sheet.

7. The assembly of claim 1 wherein:
the end of the cable is soldered to the sheet to be connected to the sheet.

8. A vehicle energy storage device monitoring assembly comprising:
a terminal connectable to an energy storage device;
a shunt formed of a first metallic material, the shunt connected at one end to the terminal;
a cable formed of a different second metallic material; and
a sheet formed of the second metallic material, the sheet attached on a portion of another end of the shunt irrespective of any connection of the cable to any of the sheet and the shunt;
wherein the cable is connected at one end to the sheet without contacting the shunt.

9. A monitoring assembly comprising:
a terminal connectable to one of a current sourcing device and a current draining device;
a shunt having first and second ends formed of a first metallic material and an intermediate portion formed of the first metallic material and a resistive material, the intermediate portion arranged between the first and second ends, the shunt connected at the first end to the terminal;
a cable formed of a different second metallic material; and
a sheet formed of the second metallic material, the sheet attached on a portion of the second end of the shunt irrespective of any connection of the cable to any of the sheet and the shunt;
wherein the cable is connected at one end to the sheet without contacting the shunt.

* * * * *